United States Patent
Menkus

(10) Patent No.: US 7,088,281 B1
(45) Date of Patent: Aug. 8, 2006

(54) COARSE CHANNEL CALIBRATION FOR FOLDING ADC ARCHITECTURES

(75) Inventor: Christopher Alan Menkus, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/757,750

(22) Filed: Jan. 14, 2004

(51) Int. Cl.
*H03M 1/12* (2006.01)

(52) U.S. Cl. .................. 341/156; 341/120; 341/118

(58) Field of Classification Search ............ 341/155, 341/156, 159, 161, 120, 118; 314/118, 120
See application file for complete search history.

(56) References Cited

U.S. PATENT DOCUMENTS

| | | | | |
|---|---|---|---|---|
| 4,137,525 A | * | 1/1979 | Tyrrel | 341/108 |
| 5,126,742 A | * | 6/1992 | Schmidt et al. | 341/156 |
| 5,184,127 A | * | 2/1993 | Myers | 341/122 |
| 5,309,157 A | * | 5/1994 | Yee | 341/156 |
| 5,835,047 A | * | 11/1998 | Vorenkamp et al. | 341/156 |
| 5,926,123 A | * | 7/1999 | Ostrom et al. | 341/120 |
| 6,175,323 B1 | * | 1/2001 | Flynn | 341/156 |
| 6,535,156 B1 | * | 3/2003 | Wang et al. | 341/156 |
| 6,628,216 B1 | * | 9/2003 | Chen et al. | 341/120 |
| 6,677,879 B1 | * | 1/2004 | Nix et al. | 341/161 |
| 6,791,484 B1 | * | 9/2004 | Lee et al. | 341/118 |

* cited by examiner

*Primary Examiner*—Linh V. Nguyen
(74) *Attorney, Agent, or Firm*—Darby & Darby PC; Matthew M. Gaffney

(57) ABSTRACT

A circuit for calibrating a coarse channel circuit in a folding analog-to-digital converter circuit. A reference value is input to the coarse channel circuit and an output of the coarse channel circuit is sensed. A parameter of the coarse channel circuit is adjusted until the coarse channel circuit is successfully calibrated.

22 Claims, 8 Drawing Sheets

US 7,088,281 B1

COARSE CHANNEL CALIBRATION FOR FOLDING ADC ARCHITECTURES

FIELD OF THE INVENTION

The invention is related to analog-to-digital conversion, and, in particular, to an apparatus and method for coarse channel calibration for a folding analog-to-digital converter.

BACKGROUND OF THE INVENTION

An analog-to-digital converter (ADC) is employed to change/convert an analog input signal into a digital output signal. There are several different types of ADCs in current use, including pipeline, flash and folding. For pipeline ADCs, separate decoding stages are arranged in a pipeline to convert the analog signal into a digital signal.

In a flash ADC, k bits of resolution employ $2^k$ comparators to convert an analog signal into a digital signal. Folding ADCs are a variation of a typical flash ADC architecture except that they are arranged to map the analog input signal range into N regions where each of these N regions share the same comparators. In a folding ADC, the total number of comparators is typically $2^k/N$. Also, a folding ADC includes a coarse channel for determining from which of the N input regions the analog input signal originated. Usually, the coarse channel is configured to use coarse reference voltages that are spaced according to the voltage spacing between each folded region.

BRIEF DESCRIPTION OF THE DRAWINGS

Non-limiting and non-exhaustive embodiments of the present invention are described with reference to the following drawings, in which.

DETAILED DESCRIPTION

Figure 1:
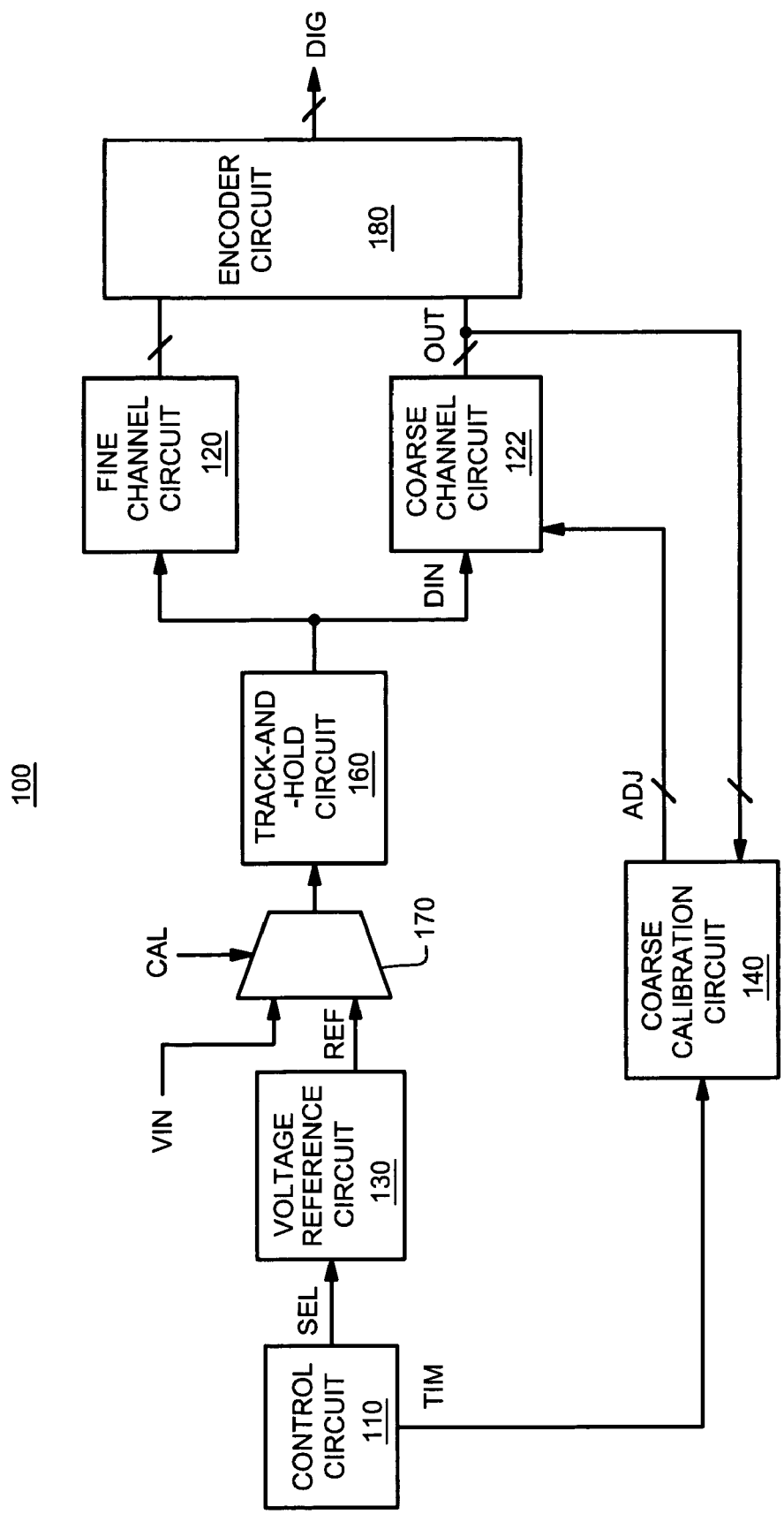
FIG. 1 illustrates a block diagram of a folding analog-to-digital converter circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The phrase "in one embodiment," as used herein does not necessarily refer to the same embodiment, although it may. The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to calibrating a coarse channel circuit for accuracy in a folding analog-to-digital converter. A reference value is input to the coarse channel circuit and its output is sensed. A parameter is subsequently adjusted until the coarse channel circuit is calibrated to a level of accuracy.

FIG. 1 illustrates a block diagram of one embodiment of the inventive folding analog-to-digital converter circuit (100). Circuit 100 includes several components such as a control circuit (110), a voltage reference circuit (130), a multiplexer circuit (170), a track-and-hold circuit (160), a fine channel circuit (120), a coarse channel circuit (122), an encoder circuit (180), and a coarse channel calibration circuit (140). FIG. 1 shows the particular arrangement of the inputs and outputs of the various components, and it is notable that the coarse channel calibration circuit 140 is coupled to coarse channel circuit 122. In one embodiment, all of the components of circuit 100 are included in the same chip. Alternatively, one or more of the components of circuit 100 may be off-chip.

A calibration signal (CAL) corresponds to a first logic level if calibration of circuit 100 is enabled and corresponds to a second logic level if the calibration is disabled. The CAL signal is employed to control the operation of multiplexer 170. According to one embodiment, circuit 100 is calibrated at power-on, and is also calibrated if the signal level at a calibration node (pin) is reversed, e.g., changing the voltage at the pin from low to high or high to low. In another embodiment, the calibration of circuit 100 may be performed at periodic intervals. In yet another embodiment, the calibration of circuit 100 may be performed continuously in the background.

Also, multiplexer circuit 170 is configured to provide an analog input signal (VIN) to an input of track-and hold circuit 160 if signal CAL corresponds to a second logic level. Multiplexer circuit 170 is further configured to receive a voltage reference signal (REF) and provide the received REF signal to the input of track-and-hold circuit 160 if signal CAL corresponds to the first logic level. Track-and-hold circuit 160 is further configured to sample-and-hold the signal at its input to provide a coarse channel input signal (DIN) to the inputs of fine channel circuit 120 and course channel circuit 122. In one embodiment, track-and-hold circuit 160 is a switched capacitor circuit, and the like.

Encoder circuit 180 provides a digital output signal (DIG) based on signals provided in parallel by fine channel circuit 120 and coarse channel circuit 122. Coarse channel circuit 122 and fine channel circuit 120 are configured to convert in parallel the DIN signal received from track-and-hold circuit 160 into signals that are subsequently provided to the inputs of encoder circuit 180. Encoder circuit 180 is configured to provide signal DIG using signal information from both coarse channel circuit 122 and fine channel circuit 120. In one embodiment, coarse channel circuit 122 is a (non-folded) flash ADC. Also, fine channel circuit 120 includes folding stages. Additionally, since encoder circuit 180 is not employed during the calibration process, it may be disabled if signal CAL corresponds to the second logic level, such that signal DIG is not provided.

Control circuit 110 is configured to provide a select signal (SEL) for selecting a voltage reference. Further, control circuit 110 is arranged to assert a timing signal (TIM) for latching coarse channel calibration circuit 140 at a pre-determined amount of time after it changes the select signal (SEL). For example, signal TIM may be asserted after a pre-determined settling time has occurred.

Voltage reference circuit 130 is configured to provide signal REF, which is associated with signal SEL. In one embodiment, voltage reference circuit 130 includes a relatively accurate voltage reference subdivided across a resistor ladder, and CMOS switches to select one of the reference voltages. In other embodiments, reference circuit 130 may have different architectures.

Track-and-hold circuit 160 is configured to receive signal REF during calibration. Coarse channel circuit 122 is configured to receive an output signal from track-and-hold circuit 122. Coarse channel circuit 122 is further configured to provide an output signal (OUT) in response to the output signal from the track-and-hold circuit. Signal OUT includes a plurality of comparator outputs (COMPOUT1–COMPOUTK) (as shown in more detail in FIG. 2). K is the number of comparators in coarse channel circuit 122. Any desired number of reference voltages may be tested during the calibration. According to one embodiment, one reference voltage is tested during calibration. However, in another embodiment, a reference voltage associated with each code transition of signal DIG is tested for calibration. According to yet another embodiment, a reference voltage associated with each folded region transition is tested for calibration. In one embodiment, coarse channel circuit 122 is arranged to process the DIN signal at substantially the same conversion speed that is used during encoding.

Also, in one embodiment, coarse channel circuit 122 is arranged to provide a feedback signal (FB). According to one embodiment, the FB signal includes at least a portion of the OUT signal. In another embodiment, although not shown, signal FB may be provided by an off-chip digital signal processor (DSP).

Further, coarse channel calibration circuit 140 is arranged to receive the FB signal. Coarse channel calibration circuit 140 is further arranged to latch the FB signal in response to the assertion of the TIM signal. Coarse channel calibration circuit 140 is further arranged to provide an adjustment signal (ADJ) to coarse channel calibration circuit 140 in response to the FB signal. Additionally, coarse channel calibration circuit 140 is configured to adjust a parameter of coarse channel circuit 122 via the ADJ signal, until the OUT signal is successfully calibrated for the currently selected voltage reference signal (REF).

Figure 2:
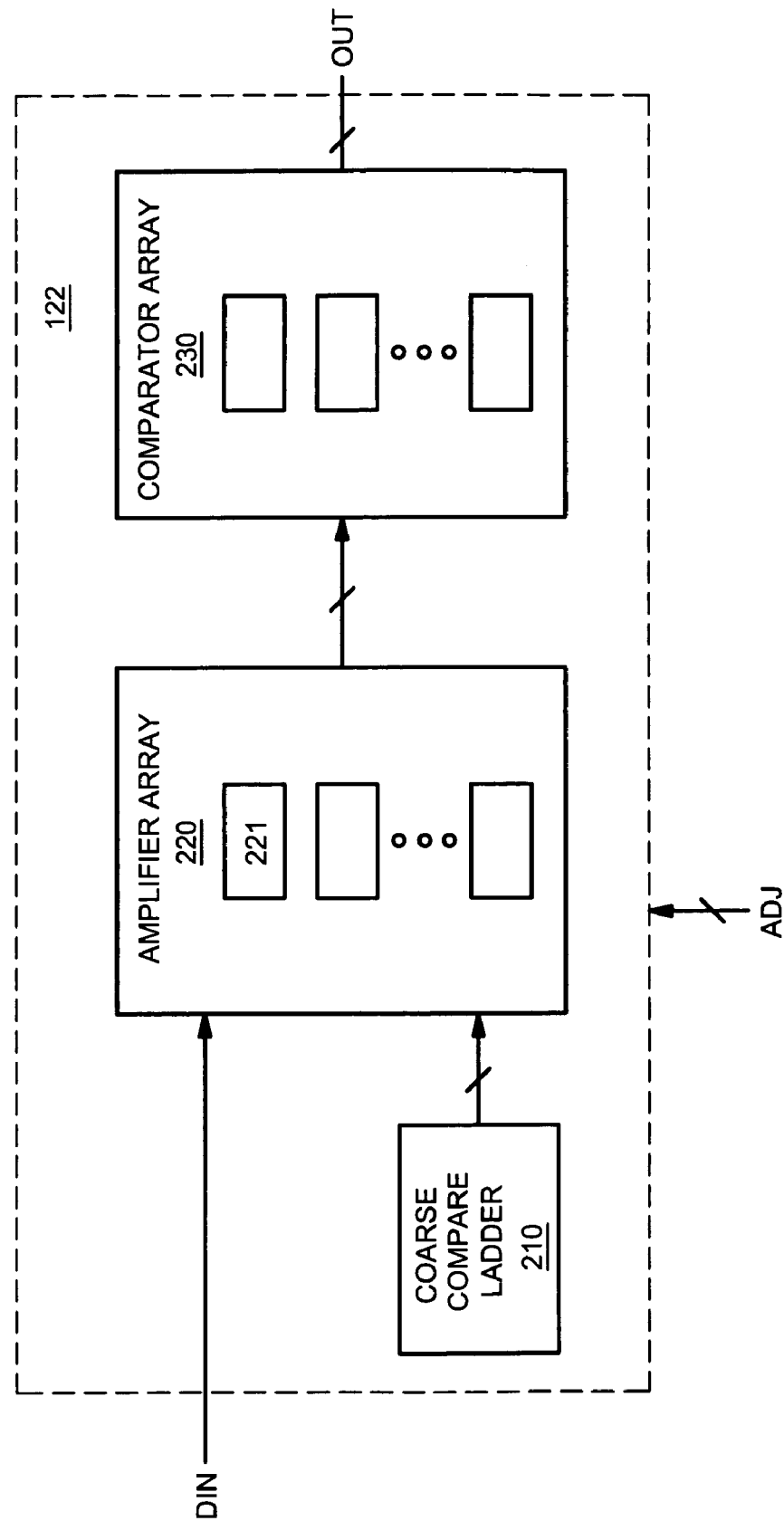
FIG. 2 shows a block diagram of an exemplary embodiment of the coarse channel circuit of FIG. 1.

FIG. 2 shows a block diagram of an exemplary embodiment of coarse channel circuit 122 as illustrated in FIG. 1. In this embodiment, coarse channel circuit 122 is shown to include a coarse reference circuit (210), an amplifier array (220), and a comparator array (230). Coarse reference circuit 210 may include a resistor ladder, other means of generating reference voltages, and the like. Amplifier array 220 includes an array of K amplifiers, including amplifier 221. Comparator array 230 includes an array of K comparators. Coarse reference circuit 210 is configured to provide a plurality of coarse reference voltages. The plurality of coarse voltage references are spaced corresponding to the voltage spacing between each folded region of the fine channel circuit. Comparator array 230 is configured to compare signal DIN with each of the plurality of coarse reference voltages, if amplifier array 220 is not included in coarse channel circuit 122. If amplifier array 220 is included in coarse channel circuit 122, amplifier array 220 is configured to increase the signal amplitude before the comparison is made such that smaller comparators may be used in comparator array 230. Although only one amplifier array is shown in FIG. 2, in another embodiment coarse channel circuit 122 may contain no amplifier arrays, one or more additional amplifier arrays, and the like.

Amplifier array 220 is configured to receive signal ADJ (e.g. signals bcout1 and bcoutr, as described below). However, in another embodiment, signal ADJ may be received by another part of coarse channel circuit 122, such as a subsequent amplifier stage (not shown), comparator array 230, and the like.

According to another exemplary embodiment, signal ADJ includes K differential signals, ADJ1–ADJK. In this case, amplifier array 220 would include K amplifiers where each of the K amplifiers is configured to receive a corresponding one of the differential signals ADJ 1-ADJK. Also, each of the differential signals ADJ 1-ADJK may comprise a differential current, where each differential current is provided by a corresponding pair of current DACs. According to other embodiments, signal ADJ can include virtually any number of differential signals, or only one differential signal. According to one embodiment, signal ADJ includes one or more differential signals. According to another embodiment, signal ADJ includes one or more single-ended signals.

Figure 3A:
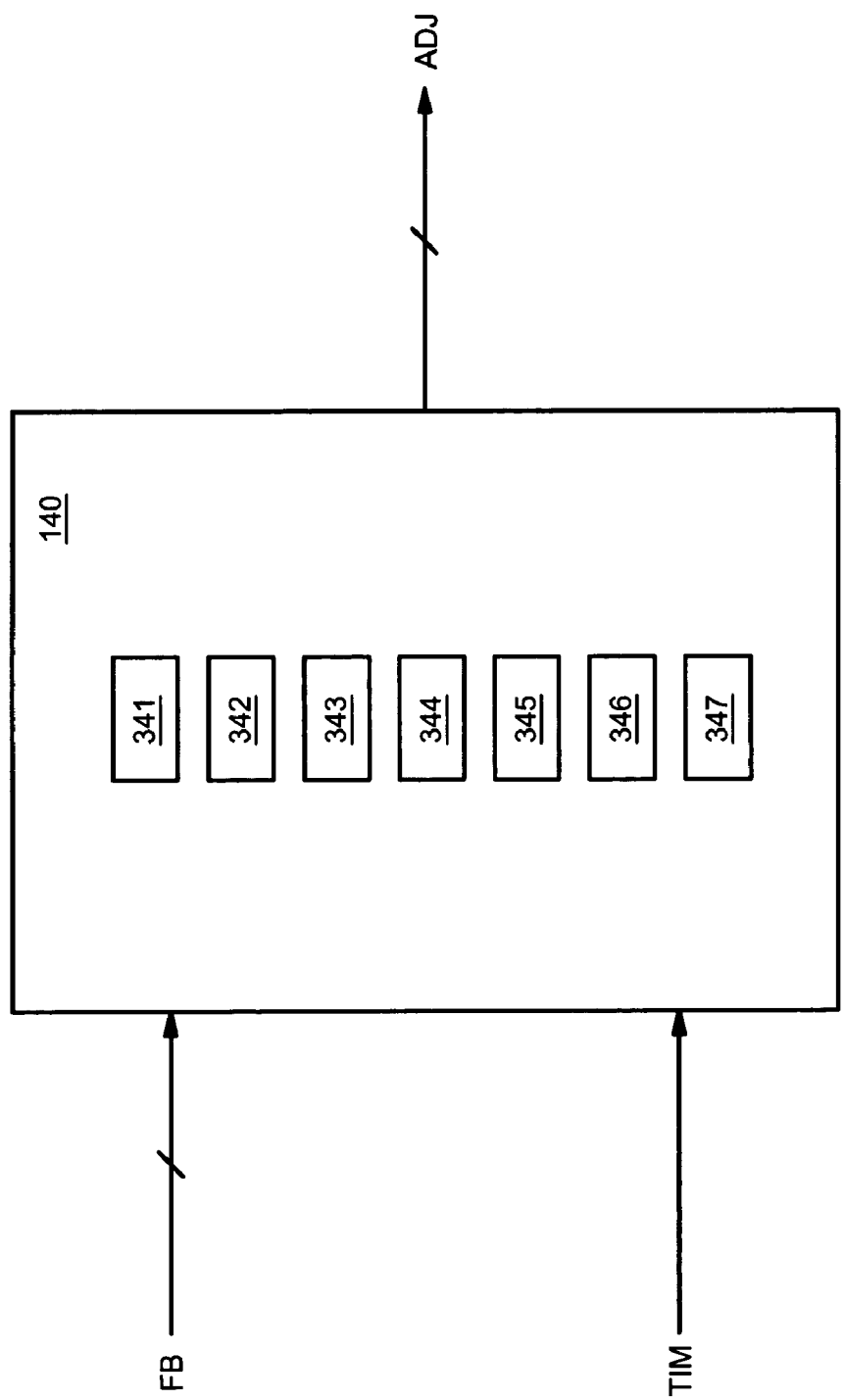
FIG. 3A illustrates a block diagram of an exemplary embodiment of the coarse channel adjustment circuit of FIG. 1.

FIG. 3A illustrates a block diagram of an exemplary embodiment of coarse channel adjustment circuit 140. In this embodiment, coarse channel calibration circuit 140 includes seven calibration circuits (e.g. 341–347). In another embodiment (not shown), coarse channel adjustment circuit may include only one calibration circuit (341). In yet another embodiment, coarse channel adjustment circuit 140 may include a plurality of calibration circuits substantially equivalent to the number (K) of comparators in the coarse channel circuit. In still another embodiment, coarse channel adjustment circuit 140 may include some other number of calibration circuits. In any case, coarse channel adjustment circuit 140 is configured to receive the FB signal. Also, in one embodiment, the OUT signal is arranged to also be the FB signal for coarse channel adjustment circuit 140.

Figure 3B:
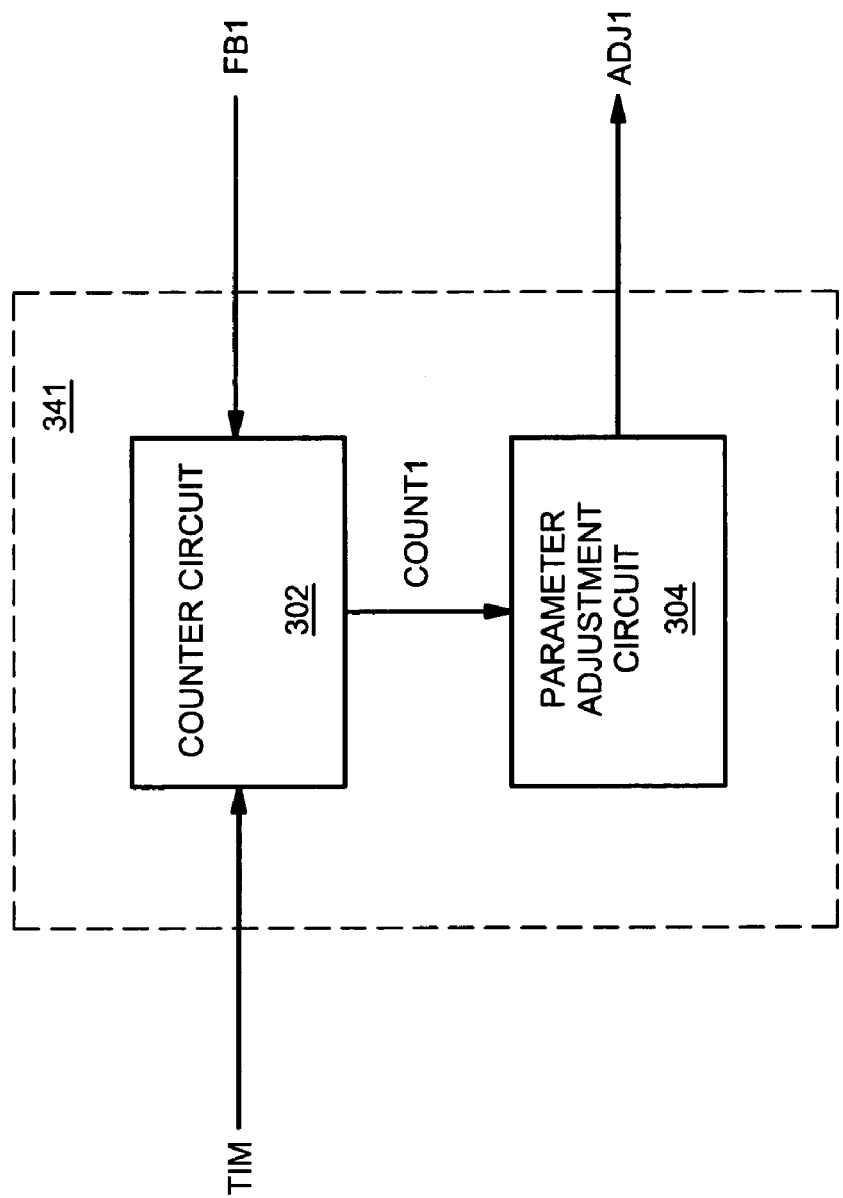
FIG. 3B shows a block diagram of an exemplary embodiment of one of the calibration circuits of FIG. 3A.

FIG. 3B shows a block diagram of an exemplary embodiment of calibration circuit 341 which includes a counter circuit (302) and a parameter adjustment circuit (304). Counter circuit 302 is coupled to coarse channel circuit 122. Also, parameter adjustment circuit 304 is coupled to counter circuit 302 and coarse channel circuit 122.

Signal COUNT includes signal COUNT1, signal FB includes signal FB1, and signal ADJ includes signal ADJ1. Also, counter circuit 302 is configured to provide signal COUNT1 in response to signal FB1 and signal TIM. Parameter adjustment circuit 304 is configured to receive signal COUNT1 and adjust the parameter of coarse channel circuit 122 in response to signal COUNT1. Counter circuit 302 is configured to, if latched by signal TIM: increment a count value that is associated with signal COUNT1 if signal FB1 corresponds to a first logic level, and decrement the count value if signal FB1 corresponds to a second logic level.

According to one embodiment, signal COUNT includes signals (COUNT1–COUNTK), signal FB includes signals FB1–FBK, and signal ADJ includes signals ADJ1–ADJK. In this embodiment, coarse channel circuit 122 includes K counter circuits and K parameter adjustment circuits. Each of the K counter circuits provides a corresponding signal COUNT1–COUNTK in response to a corresponding comparator output signal COMPOUT1–COMPOUTK. Each of the K parameter adjustment circuits receives a corresponding signal COUNT1–COUNTK and provides a corresponding signal ADJ1–ADJK.

Counter circuit 302 is configured to be latched by signal TIM to allow timing requirements (e.g. settling time) to be met. Control circuit 110 is configured to provide signal TIM at a pre-determined period of time after signal SEL is changed such that the timing requirements are met.

According to one embodiment, counter circuit 302 is a bi-directional counter, and the like. However, in another embodiment, counter circuit 302 may be a uni-directional counter, and the like.

Figure 4:
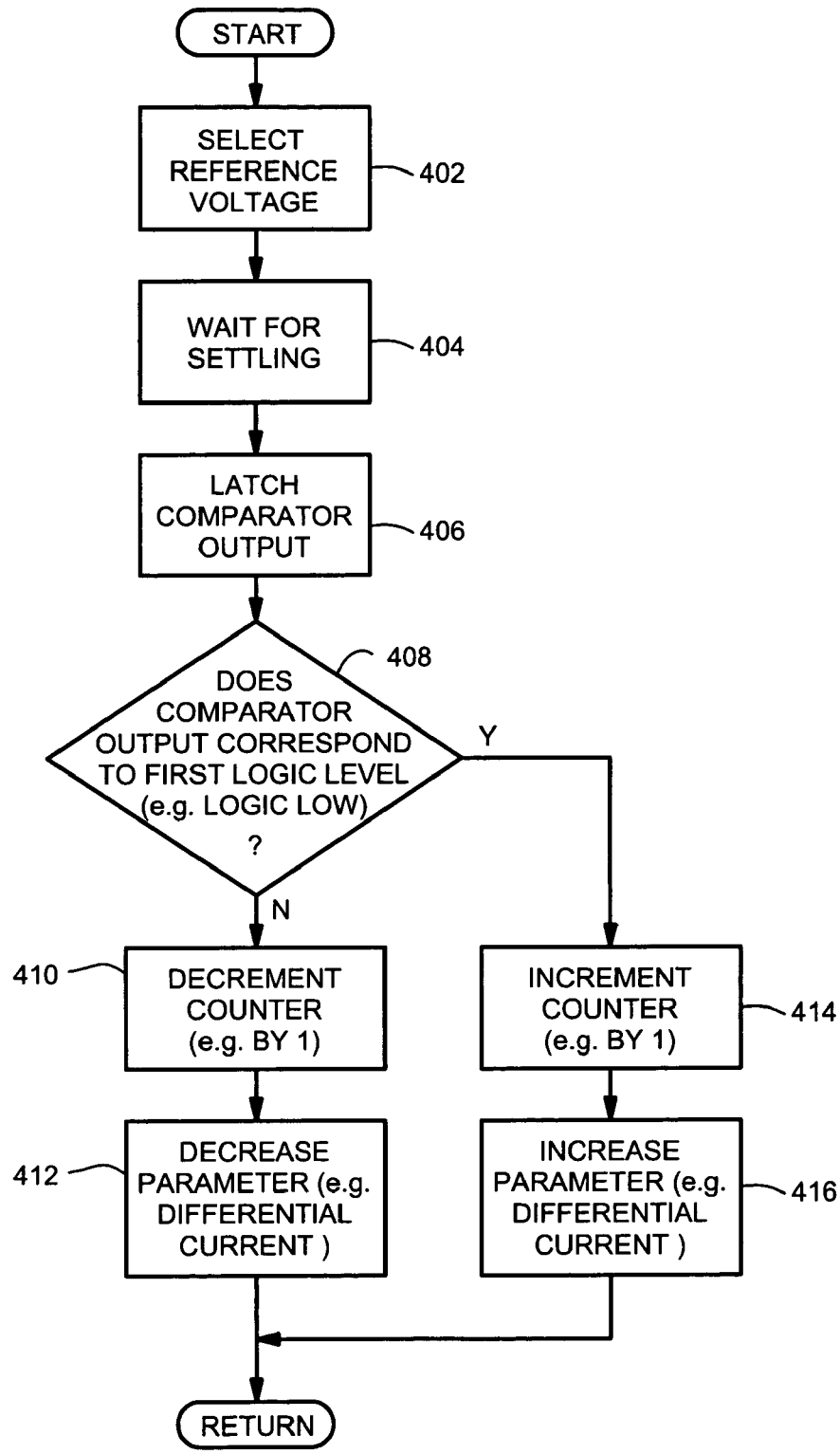
FIG. 4 illustrates a flow chart of an exemplary process of coarse channel calibration for a folding ADC architecture.

FIG. 4 illustrates a flow chart of an exemplary process of coarse channel calibration (400) for a folding ADC architecture.

After a start block, the process proceeds to block 402 where a voltage reference is selected. At block 404, the process waits for a settling period of time to finish. Next, the process steps to block 406 where a comparator output for the coarse channel circuit is latched. From block 406 the process advances to decision block 408, where a determination is made as to whether the comparator output corresponds to a first logic level. If no, the process moves to block 410 where the count value of the counter circuit is decremented (e.g. by one). Next, the process proceeds to block 412 where a parameter of the coarse channel circuit is decreased. From block 412, the process moves to a return block and returns to performing other actions.

However, if the determination at decision block 408 was affirmative (i.e. if the comparator output corresponds to a second logic level), the process would have moved to block 414 where the count value would be incremented (e.g. by one). Next, the process would advance to block 416 where the parameter of the coarse channel circuit would be increased. Next, the process would proceed to the return block and return to performing other actions.

The process may be repeated for each reference voltage. In one embodiment, a different reference voltage would be selected for each iteration of the process. In another embodiment, the process would be repeated several times for the same reference voltage. The number of iterations to ensure a full range of calibration would be dependent on the number of bits used by the counter circuit. A counter circuit with a larger number of bits would enable a greater resolution in the calibration, but require a greater number of iterations to ensure that the full calibration range is reached. Once calibration is successfully completed, the comparator output can toggle between a logical one and a logical zero. Accordingly, a successful calibration enables the OUT signal to have an error corresponding to one least significant bit of the count value. This error can be made small compared to the allowable tolerance by adjusting the smallest adjustment step size.

Prior to beginning process 400, the count value may be reset to a mid-point value. In this way, less iterations may be required to cover the full calibration range. For example, a five-bit bi-directional counter may be used, with the count value being reset to a mid-point value (e.g. binary number 10000) before initiating process 400. A minimum of sixteen iterations would be required for the count value to go from 10000 to 00000. If the count value was not reset at the beginning of the calibration, a minimum of 31 iterations would be required to ensure covering the full calibration range. For example, the count value could initially be at 00000, and a minimum of 31 iterations would be required to go from 00000 to 11111.

Additionally, process 400 may be performed for one, some, or all of the comparators in the coarse channel circuit. Also, according to the embodiment illustrated in FIG. 4, the parameter is decreased if the count value is decremented, and increased if the count value is incremented. In yet another embodiment, the parameter may be increased if the count value is decremented, and decreased if the count value is incremented.

Figure 5A:
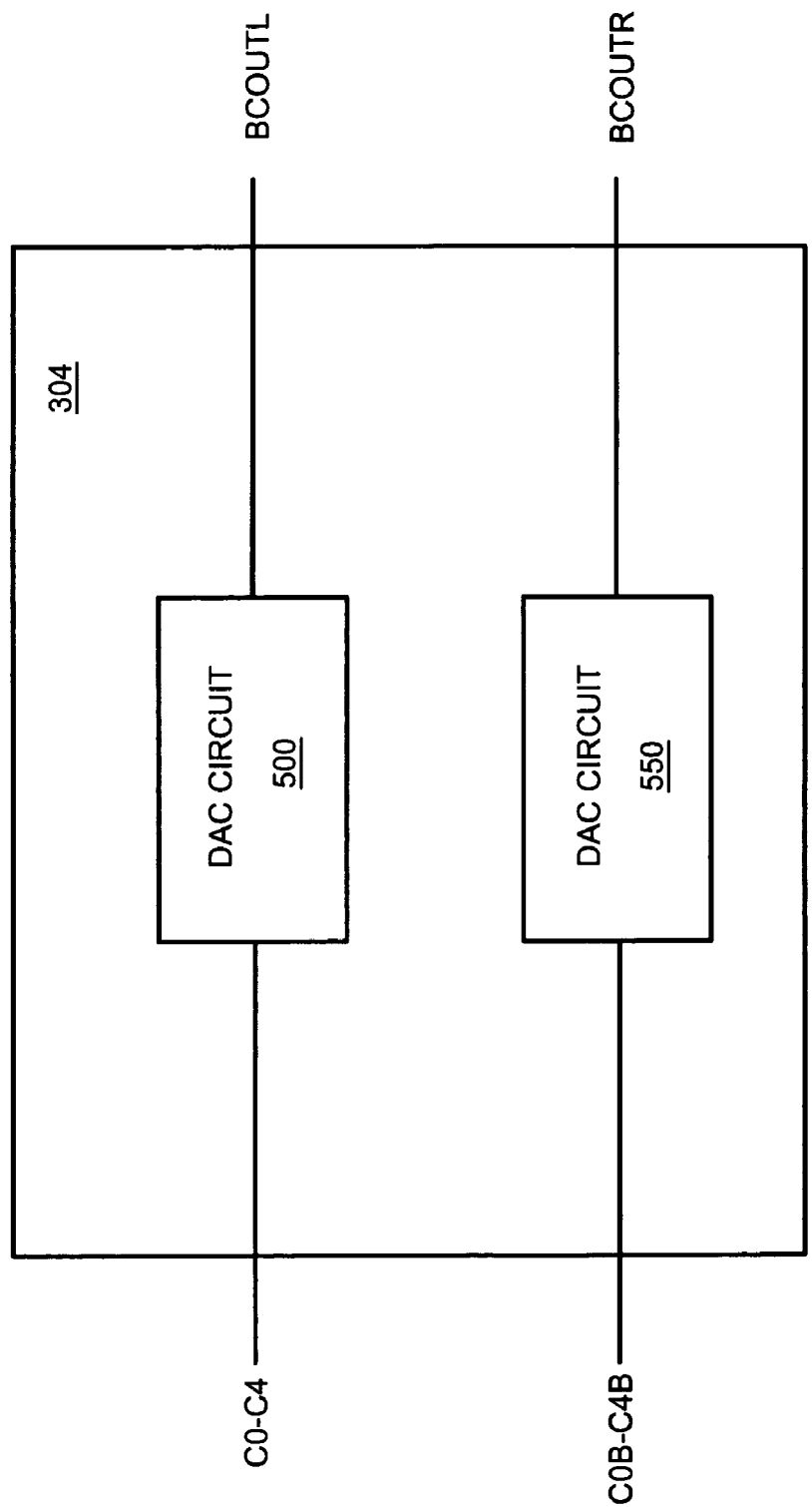
FIG. 5A shows an exemplary embodiment of the parameter adjustment circuit of FIG. 3B.

FIG. 5A shows an exemplary embodiment of parameter adjustment circuit 304. In this embodiment, parameter adjustment circuit 304 includes a first current DAC circuit (500), and a second current DAC circuit (550). In this exemplary embodiment, signal ADJ is a differential signal that includes signals bcout1 and bcoutr. In this embodiment, signal COUNT is a five-bit signal. Signal COUNT includes signals c0–c4. An inverted count signal includes signals c0b–c4b. DAC circuit 500 is further configured to convert signal COUNT into signal bcout1. Also, DAC circuit 550 is configured to convert the inverted count signal (c0b–c4b) into signal bcoutr. Additionally, DAC circuit 500 and DAC circuit 550 may include substantially equivalent architectures.

Figure 5B:
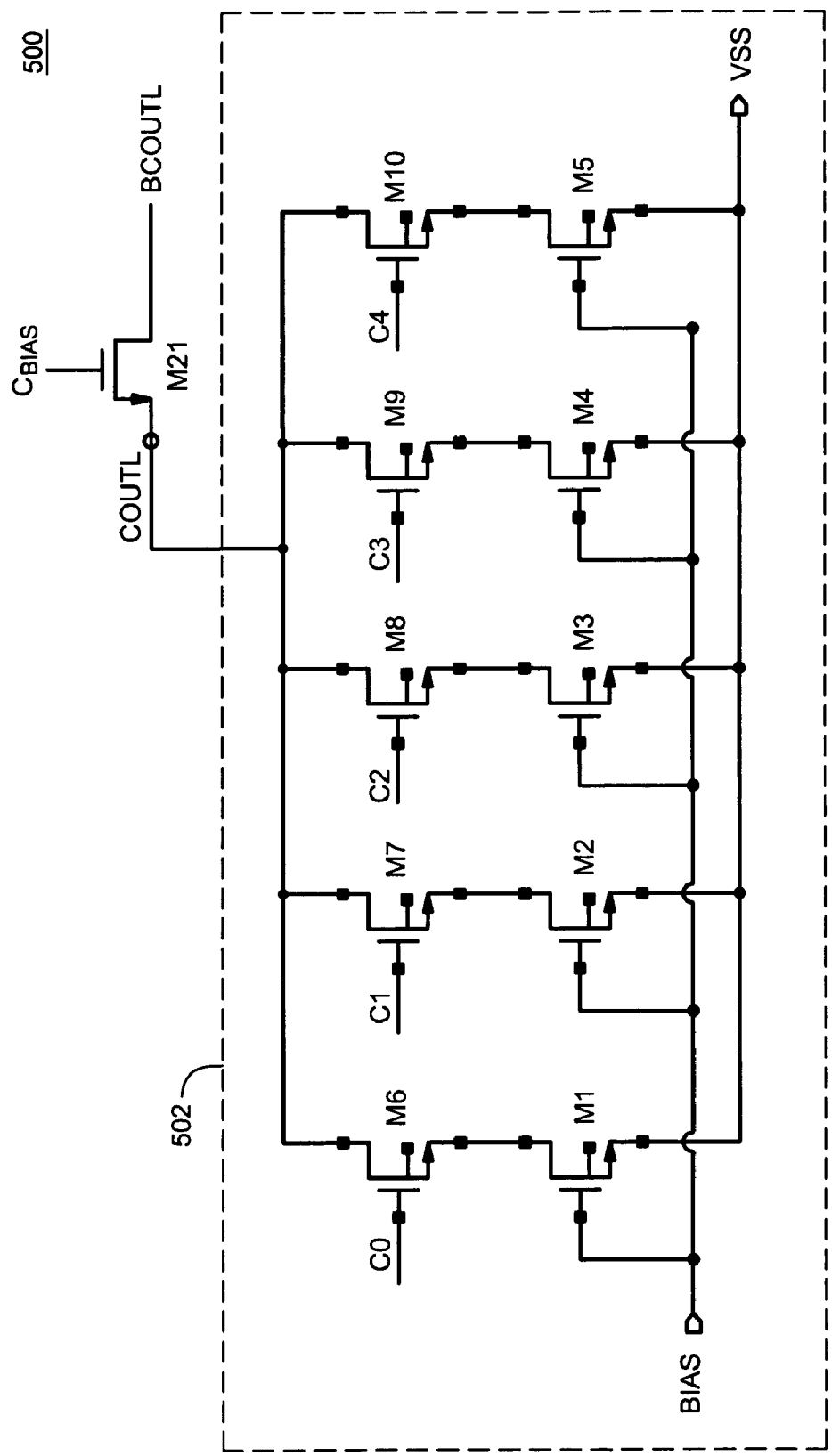
FIG. 5B schematically illustrates an exemplary embodiment of one of the current DAC circuits of FIG. 5A.

FIG. 5B schematically illustrates an exemplary embodiment of current DAC circuit 500. Current DAC circuit 500 includes a current DAC (502) and transistor M21. Transistor M21 is an optional circuit element for current DAC circuit 500. Also, current DAC 502 includes transistors M1–M10. Current DAC 502 is configured to convert signal COUNT into signal cout1. Signal cout1 has an associated analog current.

Transistors M6–M10 are each configured to operate as a switch. Transistors M6–M10 are each configured to be on when its gate terminal is at an active level, and off when its gate terminal is at an inactive level. Transistors M1–M5 are each configured to provide a scaled current. For example, transistors M1–M5 may each be scaled at a ratio of 32:16: 8:4:1. Accordingly, the current associated with signal cout1 is decoded according to signal COUNT, and the current associated with signal coutr is decoded according to the inverted count signal.

Optional transistor M21 is configured to operate as a cascode transistor and provide signal bcout1 in response to signal cout1. Transistor M21 is configured to operate as a current buffer. Additionally, bias signal cbias is a cascode bias signal for transistor M21.

Figure 6:
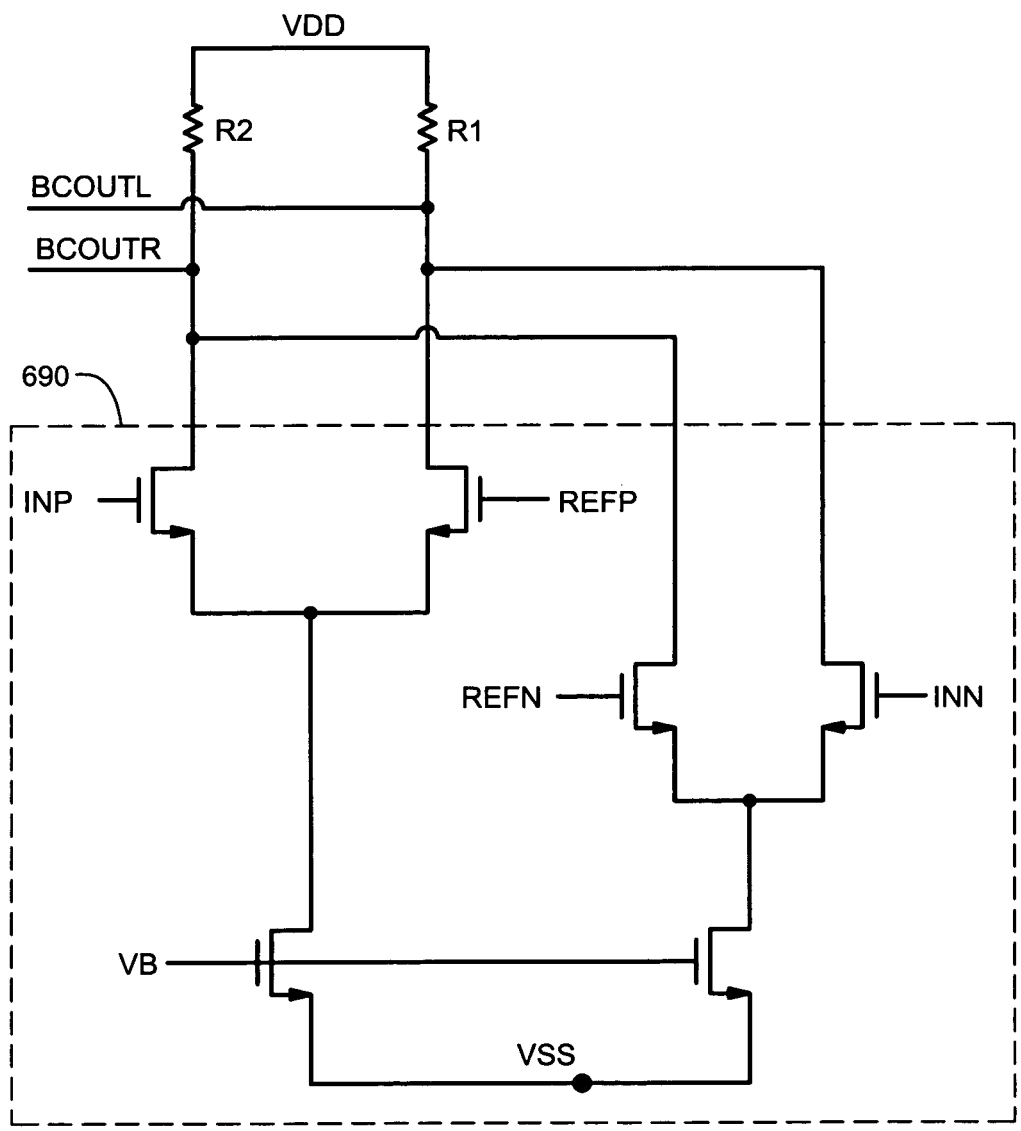
FIG. 6 schematically illustrates an exemplary embodiment of one of the amplifiers of FIG. 2, arranged in accordance with aspects of the present invention.

FIG. 6 schematically illustrates an exemplary embodiment of amplifier 221. Amplifier 221 is configured to receive a differential coarse reference voltage (REFP, REFN) and a coarse channel input signal (DIN, which includes INN and INP). In one embodiment, the DIN signal is a differential signal. In another embodiment, the DIN signal is a single-ended signal. OTA 690 in amplifier 221 is further configured to provide a differential output current. To convert the differential current to a differential output voltage, a first load (R1) is configured to receive a first half of the differential output current, and a second load (R2) is configured to receive a second half of the differential output current. Although loads R1 and R2 are shown as resistors, other types of loads may be used for loads R1 and R2, including, but not limited to, transistors.

In one embodiment, the parameter adjustment circuit (304) shown in FIG. 5A is coupled to amplifier 221 such that signal bcout1 is provided at load R1, and signal bcoutr is provided at load R2. In other embodiments, signals bcout1 and bcoutr may coupled to amplifier 221 in a different manner. The differential output voltage is determined according to signals REFP, REFN, INN, and INP, and is further modified by signals bcout1 and bcoutr to adjust for offset error. The offset error may be caused by process variation, threshold variation, and the like. Offset error may result from any component, including track-and-hold circuit 160, coarse voltage reference ladder 210, amplifier array 220, other amplifier arrays, and comparator array 230. Amplifier and comparator offsets, as well as mismatch in resistor values and current mirror ratios, can all contribute to the total offset error. Although offset error can result from multiple components, the total offset error may be corrected at one point in the chain of components.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for analog-to-digital conversion, comprising:
a fine channel circuit that includes folding stages;
a coarse channel circuit; and
a coarse channel calibration circuit that is coupled to the coarse channel circuit,
wherein the coarse channel calibration circuit includes:
  a counter circuit that is coupled to the coarse channel circuit; and
  a parameter adjustment circuit that is coupled to the counter circuit and the coarse channel circuit, wherein
the coarse channel circuit is configured to provide a feedback signal,
the counter circuit is configured to:
  receive the feedback signal, and
  provide a count signal in response to the feedback signal, and wherein
the parameter adjustment circuit is configured to:
  receive the count signal, and
  adjust a parameter of the coarse channel circuit in response to the count signal, and
wherein the counter circuit is configured to, if latched:
  increment a count value that is associated with the count signal if the comparator output corresponds to a first logic level, and
  decrement the count value if the comparator output corresponds to a second logic level.

2. The circuit of claim 1, further comprising:
a control circuit that is configured to provide a select signal; and
a voltage reference circuit that is configured to provide a voltage reference signal that corresponds to the select signal, wherein
the coarse channel circuit is configured to receive the voltage reference signal.

3. The circuit of claim 1,
wherein the coarse channel circuit is configured to provide an output signal in response to a voltage reference signal.

4. The circuit of claim 3,
wherein the output signal includes the feedback signal.

5. The circuit of claim 1,
wherein the coarse channel circuit comprises an amplifier array and a comparator array, and
wherein at least one of the amplifier array or the comparator array is configured to receive an adjustment signal.

6. The circuit of claim 5,
wherein the coarse channel calibration circuit is configured to:
  provide the adjustment signal to the coarse channel circuit in response to the feedback signal.

7. The circuit of claim 1,
wherein the parameter adjustment circuit includes a digital-to-analog converter circuit, and
wherein the digital-to-analog converter circuit is configured to provide a converted signal to the coarse channel circuit.

8. The circuit of claim 1,
wherein the parameter comprises one of a single-ended current or differential current.

9. The circuit of claim 1, wherein
the fine channel circuit is arranged to perform a fine analog-to-digital conversion of an input signal; and
wherein the coarse channel circuit is arranged to perform a coarse analog-to-digital conversion of the input signal in parallel with fine analog-to-digital conversion.

10. The circuit of claim 1, wherein
the coarse channel circuit is arranged to perform a coarse analog-to-digital conversion; and
wherein the coarse channel calibration circuit is arranged to calibrate the coarse analog-to-digital conversion.

11. The circuit of claim 1,
wherein the coarse channel circuit includes an amplifier array.

12. A circuit for analog-to-digital conversion, comprising:
a fine channel circuit that includes folding stages;
a coarse channel circuit; and
a coarse channel calibration circuit that is coupled to the coarse channel circuit,
wherein the coarse channel calibration circuit includes:
  a counter circuit that is coupled to the coarse channel circuit; and
  a parameter adjustment circuit that is coupled to the counter circuit and the coarse channel circuit, wherein
the coarse channel circuit is configured to provide a feedback signal,
the counter circuit is configured to:
  receive the feedback signal, and
  provide a count signal in response to the feedback signal, and wherein
the parameter adjustment circuit is configured to:
  receive the count signal, and
adjust a parameter of the coarse channel circuit in response to the count signal, and
wherein the parameter adjustment circuit includes:
  a first digital-to-analog converter circuit that is configured to convert the count signal into a first analog signal; and
  a second digital-to-analog converter circuit that is configured to convert an inverted count signal into a second analog signal.

13. The circuit of claim 12, wherein
the coarse channel circuit includes an amplifier that is configured to provide a differential output current, the amplifier includes:
a first load that is configured to receive a first half of the differential output current and the first analog signal; and
a second load that is configured to receive a second half of the differential output current and the second analog signal,
the first current digital-to-analog converter circuit is configured to provide the first analog signal to the first load, and wherein
the second current digital-to-analog converter circuit is configured to provide the second analog signal to the second load.

14. The circuit of claim 13, wherein
the first current digital-to-analog converter circuit includes:
a first current digital-to-analog converter; and
a first transistor that is coupled between the first current digital-to-analog converter and the first load,
the second current digital-to-analog converter circuit includes:
a second current digital-to-analog converter; and
a second transistor that is coupled between the first current digital-to-analog converter and the first load, and wherein
the first and second transistors are each configured to operate as cascode transistors.

15. A circuit for analog-to-digital conversion, comprising:
a fine channel circuit that includes folding stages;
a coarse channel circuit;
a coarse channel calibration circuit that is coupled to the coarse channel circuit; and
a control circuit that is configured to:
provide a select signal; and
provide a timing signal at a pre-determined amount of time after providing the select signal,
wherein the coarse channel circuit is configured to provide an output signal, and
wherein the coarse channel calibration circuit is configured to latch the output signal in response to the timing signal.

16. A circuit for calibration in a folding analog-to-digital conversion architecture, the circuit comprising:
a coarse channel calibration circuit that is configured to:
receive an output signal from a coarse channel circuit of a folding analog-to-digital converter circuit; and
adjust a parameter of the coarse channel circuit in response to the output signal; and
a control circuit that is arranged to:
provide a select signal for selecting a voltage reference; and
assert a timing signal for latching the coarse channel calibration circuit at a pre-determined amount of time after a change of the select signal.

17. The circuit of claim 16,
wherein the coarse channel calibration circuit includes:
a counter circuit that is configured to provide a count signal in response to the timing signal and the output signal; and
a parameter adjustment circuit that is configured to adjust the parameter in response to the count signal.

18. A circuit for analog-to-digital conversion, comprising:
a folding analog-to-digital converter, including:
a fine channel circuit that is coupled to an input node;
a coarse channel circuit that is coupled to the input node;
a coarse channel calibration circuit that is coupled to the coarse channel circuit; and
an encoder circuit, wherein
the fine channel circuit is operable to provide a fine analog-to-digital conversion output signal by performing a fine analog-to-digital conversion on an input signal that is received at the input node;
the coarse channel circuit is operable to provide a coarse analog-to-digital conversion output signal by performing a coarse analog-to-digital conversion on the input signal;
the encoder circuit is operable to provide a digital output signal based on the coarse analog-to-digital conversion output signal and the fine analog-to-digital conversion output signal;
the coarse channel calibration circuit is operable to receive the coarse analog-to-digital output signal, and to provide an adjustment signal based on the coarse analog-to-digital output signal; and
wherein the coarse channel circuit includes:
a comparator array including a plurality of comparators, wherein
the comparator array is operable to receive the input signal and a plurality of coarse reference voltages, and to provide a plurality of comparator output signals;
the coarse analog-to-digital conversion output signal is the plurality of comparator output signals; and
wherein each of the plurality of comparators in the comparator array is arranged to: compare the input signal with a corresponding one of the plurality of coarse references voltages, and to provide a corresponding one of the plurality of comparator output signals based on the comparison.

19. A circuit for analog-to-digital conversion, comprising:
a folding analog-to-digital converter, including:
a fine channel circuit that is coupled to an input node;
a coarse channel circuit that is coupled to the input node;
a coarse channel calibration circuit that is coupled to the coarse channel circuit; and
an encoder circuit, wherein
the fine channel circuit is operable to provide a fine analog-to-digital conversion output signal by performing a fine analog-to-digital conversion on an input signal that is received at the input node;
the coarse channel circuit is operable to provide a coarse analog-to-digital conversion output signal by performing a coarse analog-to-digital conversion on the input signal;
the encoder circuit is operable to provide a digital output signal based on the coarse analog-to-digital conversion output signal and the fine analog-to-digital conversion output signal;
the coarse channel calibration circuit is operable to receive the coarse analog-to-digital output signal, and to provide an adjustment signal based on the coarse analog-to-digital output signal; and
wherein the coarse channel circuit includes:
at least one amplifier array, wherein the at least one amplifier array is operable to provide a plurality of amplifier output signals based, at least in part, on the input signal;
a comparator array including a plurality of comparators, wherein the coarse analog-to-digital conversion output signal is the plurality of comparator output signals; and wherein the comparator array is operable to receive the plurality of amplifier output signals, and to provide a plurality of comparator output signals, wherein each of the plurality of comparator output signals is based on a comparison of the input signal to a corresponding one of the plurality of coarse reference voltages, and wherein the at least one amplifier array provides gain prior to the comparison.

20. A circuit for analog-to-digital conversion, comprising:
a folding analog-to-digital converter, including:
a fine channel circuit that is coupled to an input node;
a coarse channel circuit that is coupled to the input node;
a coarse channel calibration circuit that is coupled to the coarse channel circuit; and
an encoder circuit, wherein
the fine channel circuit is operable to provide a fine analog-to-digital conversion output signal by performing a fine analog-to-digital conversion on an input signal that is received at the input node;
the coarse channel circuit is operable to provide a coarse analog-to-digital conversion output signal by performing a coarse analog-to-digital conversion on the input signal;
the encoder circuit is operable to provide a digital output signal based on the coarse analog-to-digital conversion output signal and the fine analog-to-digital conversion output signal;
the coarse channel calibration circuit is operable to receive the coarse analog-to-digital output signal, and to provide an adjustment signal based on the coarse analog-to-digital output signal;
the coarse channel circuit includes:
a comparator array including a plurality of comparators, wherein
the comparator array is operable to receive the input signal and a plurality of coarse reference voltages, and to provide a plurality of comparator output signals;
the coarse analog-to-digital conversion output signal is the plurality of comparator output signals; and
wherein each of the plurality of comparators in the comparator array is arranged to: compare the input signal with a corresponding one of the plurality of coarse references voltages, and to provide a corresponding one of the plurality of comparator output signals based on the comparison;
the comparator array is operable to receive the adjustment signal; and
wherein the comparator array is configured such that a parameter of the comparator array is adjusted based on the adjustment signal.

21. A circuit for analog-to-digital conversion, comprising:
a folding analog-to-digital converter, including:
a fine channel circuit that is coupled to an input node;
a coarse channel circuit that is coupled to the input node;
a coarse channel calibration circuit that is coupled to the coarse channel circuit; and
an encoder circuit, wherein
the fine channel circuit is operable to provide a fine analog-to-digital conversion output signal by performing a fine analog-to-digital conversion on an input signal that is received at the input node;
the coarse channel circuit is operable to provide a coarse analog-to-digital conversion output signal by performing a coarse analog-to-digital conversion on the input signal;
the encoder circuit is operable to provide a digital output signal based on the coarse analog-to-digital conversion output signal and the fine analog-to-digital conversion output signal;
the coarse channel calibration circuit is operable to receive the coarse analog-to-digital output signal, and to provide an adjustment signal based on the coarse analog-to-digital output signal;
the coarse channel circuit includes:
at least one amplifier array, wherein the at least one amplifier array is operable to provide a plurality of amplifier output signals based, at least in part, on the input signal;
a comparator array including a plurality of comparators, wherein
the coarse analog-to-digital conversion output signal is the plurality of comparator output signals;
the comparator array is operable to receive the plurality of amplifier output signals, and to provide a plurality of comparator output signals, wherein each of the plurality of comparator output signals is based on a comparison of the input signal to a corresponding one of the plurality of coarse reference voltages, and wherein the at least one amplifier array provides gain prior to the comparison;
the comparator array is operable to receive the adjustment signal; and
wherein the comparator array is configured such that a parameter of the comparator array is adjusted based on the adjustment signal.

22. A circuit for analog-to-digital conversion, comprising:
a folding analog-to-digital converter, including:
a fine channel circuit that is coupled to an input node;
a coarse channel circuit that is coupled to the input node;
a coarse channel calibration circuit that is coupled to the coarse channel circuit; and
an encoder circuit, wherein
the fine channel circuit is operable to provide a fine analog-to-digital conversion output signal by performing a fine analog-to-digital conversion on an input signal that is received at the input node;
the coarse channel circuit is operable to provide a coarse analog-to-digital conversion output signal by performing a coarse analog-to-digital conversion on the input signal;
the encoder circuit is operable to provide a digital output signal based on the coarse analog-to-digital conversion output signal and the fine analog-to-digital conversion output signal;
the coarse channel calibration circuit is operable to receive the coarse analog-to-digital output signal, and to provide an adjustment signal based on the coarse analog-to-digital output signal;
the coarse channel circuit includes:
at least one amplifier array, wherein the at least one amplifier array is operable to provide a plurality of amplifier output signals based, at least in part, on the input signal;

a comparator array including a plurality of comparators, wherein
the coarse analog-to-digital conversion output signal is the plurality of comparator output signals;
the comparator array is operable to receive the plurality of amplifier output signals, and to provide a plurality of comparator output signals, wherein each of the plurality of comparator output signals is based on a comparison of the input signal to a corresponding one of the plurality of coarse reference voltages, and wherein the at least one amplifier array provides gain prior to the comparison; and
wherein at least one of the at least one amplifier array is operable to receive the adjustment signal such that a parameter of the at least one amplifier array in the at least one amplifier array is adjusted based on the adjustment signal.

* * * * *

UNITED STATES PATENT AND TRADEMARK OFFICE
CERTIFICATE OF CORRECTION

PATENT NO.           : 7,088,281 B1
APPLICATION NO. : 10/757750
DATED                    : August 8, 2006
INVENTOR(S)         : Christopher Alan Menkus It is certified that error appears in the above-identified patent and that said Letters Patent is hereby corrected as shown below:

On Title Page Item 56

First Page Col. 2 (U.S. Patent Documents); Line 8; After "6,628,216" delete "B1" and insert -- B2 --, therefor.

Column 4; Line 19; Delete "bcout1" and insert -- bcoutl --, therefor.

Column 4; Line 28 (Approx.); Delete "ADJ 1-ADJK." and insert -- ADJ1-ADJK. --, therefor.

Column 4; Line 29 (Approx.); Delete "ADJ 1-ADJK" and insert -- ADJ1-ADJK --, therefor.

Column 6; Line 26; Delete "bcout1" and insert -- bcoutl --, therefor.

Column 6; Line 27; Delete "bcout1." and insert -- bcoutl. --, therefor.

Column 6; Line 38; After "signal" delete "cout1." and insert -- coutl. --, therefor.

Column 6; Line 38; Before "has" delete "cout1" and insert -- coutl --, therefor.

Column 6; Line 46; Delete "cout1" and insert -- coutl --, therefor.

Column 6; Line 51; Delete "bcout1" and insert -- bcoutl --, therefor.

Column 6; Line 52; Delete "cout1." and insert -- coutl. --, therefor.

Column 7; Line 5; Delete "bcout1" and insert -- bcoutl --, therefor.

Column 7; Line 6; Delete "bcout1" and insert -- bcoutl --, therefor.

UNITED STATES PATENT AND TRADEMARK OFFICE
CERTIFICATE OF CORRECTION

PATENT NO. : 7,088,281 B1
APPLICATION NO. : 10/757750
DATED : August 8, 2006
INVENTOR(S) : Christopher Alan Menkus It is certified that error appears in the above-identified patent and that said Letters Patent is hereby corrected as shown below:

Column 7; Line 10; Delete "bcout1" and insert -- bcoutl --, therefor.

Signed and Sealed this

Third Day of April, 2007

JON W. DUDAS
*Director of the United States Patent and Trademark Office*